United States Patent
McCreery et al.

(10) Patent No.: US 9,024,297 B2
(45) Date of Patent: May 5, 2015

(54) TWO- AND THREE-TERMINAL MOLECULAR ELECTRONIC DEVICES WITH BALLISTIC ELECTRON TRANSPORT

(75) Inventors: Richard L. McCreery, Edmonton (CA); Adam Johan Bergren, Edmonton (CA)

(73) Assignees: The Governors of the University of Alberta, Edmonton, Alberta (CA); National Research Council of Canada, Ottawa, Ontario (CA)

( * ) Notice: Subject to any disclaimer, the term of this patent is extended or adjusted under 35 U.S.C. 154(b) by 0 days.

(21) Appl. No.: 13/822,626

(22) PCT Filed: Sep. 16, 2011

(86) PCT No.: PCT/US2011/051958
§ 371 (c)(1),
(2), (4) Date: May 21, 2013

(87) PCT Pub. No.: WO2012/037474
PCT Pub. Date: Mar. 22, 2012

(65) Prior Publication Data
US 2013/0221325 A1    Aug. 29, 2013

Related U.S. Application Data

(60) Provisional application No. 61/384,039, filed on Sep. 17, 2010.

(51) Int. Cl.
*H01L 29/06* (2006.01)
*H01L 29/08* (2006.01)
(Continued)

(52) U.S. Cl.
CPC ........ *H01L 51/0098* (2013.01); *H01L 51/0504* (2013.01); *H01L 51/0595* (2013.01); *H01L 51/52* (2013.01)

(58) Field of Classification Search
CPC ............ H01L 51/0048; H01L 51/0067; H01L 51/0072; H01L 51/0558; H01L 29/1606; H01L 29/0669; H01L 29/122; H01L 29/127; H01L 29/66242; H01L 29/66477; H01L 29/737
USPC ........... 257/29, 26, 12, 103, 104, 183, 66, 72, 257/223, 227, 292, 439, 443, 655, E27.1, 257/E27.125, E27.112, E29.117, E29.145, 257/E29.147, E29.182, E29.202, 257/E29.273–E29.299, E29.314, E29.32, 257/E23.016; 438/149, 163
See application file for complete search history.

(56) References Cited

U.S. PATENT DOCUMENTS 4,163,920 A    8/1979  Lambe et al.
4,272,641 A    6/1981  Hanak
(Continued)

OTHER PUBLICATIONS

PCT International Search Report for PCT Counterpart Application No. PCT/US2011/051958, 2 pgs., (Feb. 2, 2012).
(Continued)

*Primary Examiner* — Dao H Nguyen
*Assistant Examiner* — Tram H Nguyen
(74) *Attorney, Agent, or Firm* — Blakely Sokoloff Taylor Zafman LLP (57) ABSTRACT

Two- and three-terminal molecular electronic devices with ballistic electron transport are described. For example, a two-terminal molecular electronic device includes a conductor 1 layer/molecule 1 layer/conductor2 layer junction, wherein the total thickness of the molecule 1 layer and the conductor2 layer is less than or approximately equal to the mean free path of a charge carrier traveling in the two layers, and wherein ballistic transport can occur for some fraction of a plurality of charge carriers in the two layers.

25 Claims, 8 Drawing Sheets

Three-terminal ballistic junction (51) Int. Cl.
H01L 51/00 (2006.01)
H01L 51/05 (2006.01)
H01L 51/52 (2006.01)

(56) References Cited

U.S. PATENT DOCUMENTS

| | | | |
|---|---|---|---|
| 4,442,185 | A | 4/1984 | Skotheim |
| 4,482,779 | A | 11/1984 | Anderson |
| 4,833,517 | A | 5/1989 | Heiblum et al. |
| H667 | H | 9/1989 | Bedair et al. |
| 4,878,095 | A | 10/1989 | Bending et al. |
| 4,973,858 | A | 11/1990 | Chang |
| 4,980,312 | A | 12/1990 | Harris et al. |
| 5,018,000 | A | 5/1991 | Yamada et al. |
| 5,019,530 | A | 5/1991 | Kleinsasser et al. |
| 5,067,788 | A | 11/1991 | Jannson et al. |
| 5,302,838 | A | 4/1994 | Roenker et al. |
| 5,326,984 | A | 7/1994 | Rosencher et al. |
| 5,455,451 | A | 10/1995 | Usagawa et al. |
| 5,502,348 | A * | 3/1996 | Moyer et al. ............ 313/310 |
| 5,543,652 | A | 8/1996 | Ikeda et al. |
| 5,606,177 | A | 2/1997 | Wallace et al. |
| 5,621,222 | A | 4/1997 | Kimura |
| 5,712,491 | A | 1/1998 | Heiblum et al. |
| 5,796,119 | A | 8/1998 | Seabaugh |
| 5,825,049 | A | 10/1998 | Simmons et al. |
| 5,825,240 | A | 10/1998 | Geis et al. |
| 5,883,549 | A | 3/1999 | De Los Santos |
| 5,895,934 | A | 4/1999 | Harvey et al. |
| 5,994,891 | A | 11/1999 | Hubbell |
| 6,034,809 | A | 3/2000 | Anemogiannis |
| 6,049,308 | A | 4/2000 | Hietala et al. |
| 6,077,722 | A | 6/2000 | Jansen et al. |
| 6,107,562 | A | 8/2000 | Hashimoto et al. |
| 6,110,393 | A | 8/2000 | Simmons et al. |
| 6,121,541 | A | 9/2000 | Arya |
| 6,195,485 | B1 | 2/2001 | Coldren et al. |
| 6,211,531 | B1 | 4/2001 | Nakazato et al. |
| 6,284,557 | B1 | 9/2001 | Yiu et al. |
| 6,329,655 | B1 | 12/2001 | Jack et al. |
| 6,442,321 | B1 | 8/2002 | Berini |
| 6,534,784 | B2 | 3/2003 | Eliasson et al. |
| 6,563,185 | B2 | 5/2003 | Moddel et al. |
| 6,614,960 | B2 | 9/2003 | Berini |
| 6,855,417 | B2 | 2/2005 | McCreery |
| 6,855,950 | B2 | 2/2005 | McCreery |
| 6,919,128 | B2 | 7/2005 | McCreery |
| 7,019,449 | B2 | 3/2006 | McCreery |
| 7,042,006 | B2 * | 5/2006 | McCreery ............. 257/40 |
| 7,112,366 | B2 | 9/2006 | McCreery |
| 7,141,299 | B2 | 11/2006 | McCreery |
| 7,173,275 | B2 | 2/2007 | Estes et al. |
| 7,737,433 | B2 | 6/2010 | McCreery et al. |
| 7,754,064 | B2 * | 7/2010 | Buschmann et al. ...... 205/466 |
| 2003/0059147 | A1 | 3/2003 | Berini |
| 2003/0179974 | A1 | 9/2003 | Estes et al. |
| 2006/0220058 | A1 * | 10/2006 | Tavkhelidze ............ 257/104 |

OTHER PUBLICATIONS

M. Heiblum, et al., "Ballistic Hot-Electron Transistors", IBM Journal of Research and Development, vol. 34, No. 4, pp. 530-549, (Jul. 1990).

M. Heiblum, et al., "Direct Observation of Ballistic Transport in GaAs", Physical Review Letters, vol. 55, No. 20, pp. 2200-2203, (Nov. 11, 1985).

Richard L. McCreery, et al., "Progress with Molecular Electronic Junctions: Meeting Experimental Challenges in Design and Fabrication", Advanced Materials, vol. 21, pp. 1-20, (2009).

Adam Johan Bergren, et al., "Molecular Electronics using Diazonium-Derived Adlayers on Carbon with Cu Top Contacts: Critical Analysis of Metal Oxides and Filaments", Journal of Physics: Condensed Matter, vol. 20, 11 pgs., (2008).

Richard L. McCreery, et al., "Electron Transport and Redox Reactions in Carbon-Based Molecular Electronic Junctions", Physical Chemistry Chemical Physics, vol. 8, pp. 2572-2590, (2006).

Franklin Anariba, et al., "Strong Effects of Molecular Structure on Electron Transport in Carbon/Molecule/Copper Electronic Junctions", J. Phys. Chem. B, vol. 109, pp. 11163-11172, (2005).

Richard McCreery, et al., "Molecular Rectification and Conductance Switching in Carbon-Based Molecular Junctions by Structural Rearrangement Accompanying Electron Injection", J. Am. Chem. Soc., vol. 125, pp. 10748-10758, (2003).

Richard McCreery, et al., "Molecular Rectification and Conductance Switching in Carbon-Based Molecular Junctions by Structural Rearrangement Accompanying Electron Injection (Additions and Corrections)", J. Am. Chem. Soc., vol. 126, p. 6200, (2004).

Srikanth Ranganathan, et al., "Covalently Bonded Organic Monolayers on a Carbon Substrate: A New Paradigm for Molecular Electronics", Nano Letters, vol. 1, No. 9, pp. 491-494, (2001).

K.W. Hipps, et al., "Inelastic Electron Tunneling Spectroscopy", Handbook of Vibrational Spectroscopy, John Wiley & Sons Ltd., vol. 4, 19 pgs., (2002).

Srikanth Ranganathan, et al., "Electroanalytical Performance of Carbon Films with Near-Atomic Flatness", Analytical Chemistry, vol. 73, No. 5, pp. 893-900, (Mar. 1, 2001).

Srikanth Ranganathan, et al., "Photoresist-Derived Carbon for Microelectromechanical Systems and Electrochemical Applications", Journal of The Electrochemical Society, vol. 147, No. 1, pp. 277-282, (2000).

Richard L. McCreery, et al., "Advanced Carbon Electrode Materials for Molecular Electrochemistry", Chemical Reviews, vol. 108, No. 7, pp. 2646-2687, (2008).

L. O. Hocker, et al., "Frequency Mixing in the Infrared and Far-Infrared using a Metal-to-Metal Point Contact Diode", Applied Physics Letters, vol. 12, No. 12, pp. 401-402, (Jun. 15, 1968).

S. M. Faris, et al., "Detection of Optical Infrared Radiation with DC-Biased Electron-Tunneling Metal-Barrier-Metal Diodes", IEEE Journal of Quantum Electronics, vol. QE-9, No. 7, pp. 737-745, (Jul. 1973).

C. Fumeaux, et al., "Nanometer Thin-Film Ni—NiO—Ni Diodes for Detection and Mixing of 30 THz Radiation", Infrared Physics & Technology, vol. 39, pp. 123-183, (1998).

Alexander Korotkov, et al., "Resonant Fowler-Nordheim Tunneling through Layered Tunnel Barriers and its Possible Applications", International Electron Device Meeting Technical Digest, pp. 223-226, (Mar. 1999).

C. Fumeaux, et al., "Nanometer Thin-Film Ni—NiO—Ni Diodes for Mixing 28 THz $CO_2$-Laser Emissions with Difference Frequencies up to 176 GHz", Applied Physics B: Lasers and Optics, vol. 66, pp. 327-332, (1998).

Y. Yasuoka, et al., "Coupling to an "Edge Metal-Oxide-Metal" Junction via an Evaporated Long Antenna", Applied Physics Letters, vol. 34, No. 12, pp. 823-825, (Jun. 15, 1979).

J. Kuendig, et al., "Thin-Film Silicon Solar Cells for Space Applications: Radiation Hardness and Applications for an Integrated Solant (Solar Cell—Antenna) Module", 28th IEEE Photovoltaic Specialists Conference, Anchorage, Alaska, 4 pgs., (Sep. 2000).

A. N. Korotkov, et al., "TASERs: Possible DC Pumped Terahertz Lasers using Interwell Transitions in Semiconductor Heterostructures", Applied Physics Letters, vol. 65, No. 15, pp. 1865-1867, (Oct. 10, 1994).

K. Kempa, et al., "Towards Stimulated Generation of Coherent Plasmons in Nanostructures", Journal of Applied Physics, vol. 85, No. 7, pp. 3708-3712, (Apr. 1, 1999).

M. Asada, et al., "Estimation of Interwell Terahertz Gain by Photon-Assisted Tunneling Measurement in Triple-Barrier Resonant Tunneling Diodes", Applied Physics Letters, vol. 77, No. 5, pp. 618-620, (Jul. 31, 2000).

Alessandro Tredicucci, et al., "Surface Plasmon Quantum Cascade Lasers at $\lambda \sim 19$ µm", Applied Physics Letters, vol. 77, No. 15, pp. 2286-2288, (Oct. 9, 2000).

D. P. Siu, et al., "Stimulated Electron Tunneling in Metal-Barrier-Metal Structures due to Surface Plasmons", Applied Physics Letters, vol. 28, No. 7, pp. 407-410, (Apr. 1, 1976).

(56) References Cited

OTHER PUBLICATIONS

David M. Drury, et al., "Theory of Infrared and Optical Frequency Amplification in Metal-Barrier-Metal Diodes", IEEE Transactions on Microwave Theory and Techniques, vol. MTT-27, No. 6, pp. 598-603, (Jun. 1979).

David M. Drury, et al., "A Stimulated Inelastic Tunneling Theory of Negative Differential Resistance in Metal-Insulator-Metal Diodes", IEEE Journal of Quantum Electronics, vol. QE-16, No. 1, pp. 58-69, (Jan. 1980).

S. Muratake, et al., "Transistor Action of Metal ($CoSi_2$)/Insulator ($CaF_2$) Hot Electron Transistor Structure", Electronics Letters, vol. 28, No. 11, pp. 1002-1004, (May 21, 1992).

D. Lacour, et al., "Hot-Electron Transport in 3-Terminal Devices based on Magnetic Tunnel Junctions", Europhysics Letters, vol. 60, No. 6, pp. 896-902, (Dec. 15, 2002).

R. Ludeke, et al., "Quantum Interference in $SiO_2$: A Conduction-Band Mass Reappraisal", Applied Physics Letters, vol. 73, No. 9, pp. 1221-1223, (Aug. 31, 1998).

M. Heiblum, et al., "First Observation of Ballistic Holes in a p-Type THETA Device", IEEE Transactions on Electron Devices, vol. 35, No. 12, p. 2428, (Dec. 1988).

A. Otto, et al., "Controlling a Tunnel Current from the Exterior: A New Mesoscopic Quantum Effect", Europhysics Letters, vol. 62, No. 3, pp. 398-404, (May 1, 2003).

John G. Simmons, "Electric Tunnel Effect between Dissimilar Electrodes Separated by a Thin Insulating Film", Journal of Applied Physics, vol. 34, No. 9, pp. 2581-2590, (Sep. 1963).

S. R. Pollack, et al., "Electron Tunneling through Asymmetric Films of Thermally Grown $Al_2O_3$", Journal of Applied Physics, vol. 35, No. 5, pp. 1503-1512, (May 1964).

N. A. Janunts, et al., "Modulation of Light Radiation during Input into Waveguide by Resonance Excitation of Surface Plasmons", Applied Physics Letters, vol. 79, No. 3, pp. 299-301, (Jul. 16, 2001).

H. Drexler, et al., "Photon-Assisted Tunneling in a Resonant Tunneling Diode: Stimulated Emission and Absorption in the THz Range", Applied Physics Letters, vol. 67, No. 19, pp. 2816-2818, (Nov. 6, 1995).

C. A. Mead, "The Tunnel-Emission Amplifier", Proceedings of the IRE, vol. 48, No. 3, pp. 359-361, (Mar. 1960).

John G. Simmons, "Generalized Formula for the Electric Tunnel Effect between Similar Electrodes Separated by a Thin Insulating Film", Journal of Applied Physics, vol. 34, No. 6, pp. 1793-1803, (Jun. 1963).

Ursula Mazur, et al., "Orbital-Mediated Tunneling, Inelastic Electron Tunneling, and Electrochemical Potentials for Metal Phthalocyanine Thin Films", J. Phys, Chem. B, vol. 103, No. 44, pp. 9721-9727, (1999).

Neil W. Ashcroft, et al., "Solid State Physics," Brooks/Cole, pp. 6-11 and 49-53, (1976).

Jeff Drucker, et al., "Emission of Energetic Electrons from Tunnel Junctions", Physical Review B, vol. 30, No. 8, pp. 4348-4350, (Oct. 15, 1984).

B. Michael Kale, "Electron Tunneling Devices in Optics", Optical Engineering, vol. 24, No. 2, pp. 267-274, (Mar. / Apr. 1985).

E. M. Belenov, et al., "Emission of Surface Electromagnetic Waves in the Case of Resonance Tunneling of Electrons", Sov. J. Quantum Electron, vol. 17, No. 10, pp. 1348-1352, (Oct. 1987).

S. M. Sze, "Physics of Semiconductor Devices", Chapter 14, John Wiley & Sons, 49 pgs. (including cover page, table of contents, chapter 14, appendix, and index), (1981).

R. A. Volkov, et al., "Tunneling-Assisted Photon Emission in MIM Junctions," Phys. Stat. Sol. (B), vol. 163, pp. 311-320, (1991).

L. Z. Xie, "Stimulated Emission of Surface Plasmons in Metal-Insulator-Metal (Transition Metal Type Like) Structures", Infrared Phys., vol. 25, No. 5, pp. 661-664, (1985).

Jay S. Schildkraut, "Long-Range Surface Plasmon Electrooptic Modulator", Applied Optics, vol. 27, No. 21, pp. 4587-4590, (Nov. 1, 1988).

Mordehai Heiblum, "Tunneling Hot Electron Transfer Amplifiers (THETA): Amplifiers Operating Up to the Infrared", Solid-State Electronics, vol. 24, pp. 343-366, (1981).

Alan Seabaugh, et al., "Room Temperature Hot Electron Transistors with InAs-Notched Resonant-Tunneling-Diode Injector", Japanese Journal of Applied Physics, vol. 30, No. 5, pp. 921-925, (May 1991).

Satoshi Sugahara, et al., "Spin-Filter Transistor", Japanese Journal of Applied Physics, vol. 43, No. 7A, pp. L838-L841, (2004).

G. Papp, et al., "Current Rectification through a Single-Barrier Resonant Tunneling Quantum Structure", Superlattices and Microstructures, vol. 17, No. 3, pp. 273-275, (1995).

Takashi Suemasu, et al., "Metal($CoSI_2$)/Insulator($CaF_2$) Resonant Tunneling Diode", Japanese Journal of Applied Physics, vol. 33, Part 1, No. 1A, pp. 57-65, (Jan. 1994).

M. Asada, et al., "Theoretical Analysis and Fabrication of Small Area Metal/Insulator Resonant Tunneling Diode Integrated with Patch Antenna for Terahertz Photon Assisted Tunneling", Solid-State Electronics, vol. 42, No. 7-8, pp. 1543-1546, (1998).

A. G. Aleksanyan, et al., "Feasibility of Developing a Tunable Oscillator Utilizing a System of Metal-Barrier-Metal-Barrier-Metal Junctions", Sov. J. Quantum Electron, vol. 11, No. 5, pp. 635-637, (May 1981).

A. G. Aleksanyan, et al., "Generation of Electromagnetic Oscillations in Metal-Barrier-Metal-Barrier-Metal Structures", Sov. J. Quantum Electron, vol. 12, No. 8, pp. 1090-1092, (Aug. 1982).

E. M. Belenov, et al., "Amplification of Surface Plasma Oscillations in Complex Metal-Barrier-Metal Structures", Sov. J. Quantum Electron, vol. 12, No 7, pp. 930-931, (Jul. 1982).

E. M. Belenov, et al, "Investigation of the Radiation Emitted by Metal-Barrier-Metal Structures", Sov. J Quantum Electron, vol. 13, No, 4, pp. 451-455, (Apr. 1983).

E M. Belenov, et al., "Angular Distribution of the Luminescence Emitted by a Metal-Barrier-Metal Diode", Sov. J. Quantum Electron, vol. 15, No. 5, pp. 735-737, (May 1985).

A. IU. Bykovskii, et al, "Influence of the Boundary of a Metal Film on the Luminescence Intensity from a Metal-Barrier-Metal Structure," Sov. Phys. Tech. Phys., vol. 31, No. 8, pp. 980-981, (Aug. 1986).

E. M. Belenov, et al., "Resonant Tunneling in Multilayer Structures in the Presence of Surface Electromagnetic Waves," Sov. Tech. Phys. Lett., vol. 12, No. 4, pp. 200-202, (Apr. 1986).

PCT Written Opinion of the International Searching Authority for PCT Counterpart Application No. PCT/US2011/051958, 4 pgs., (Feb. 2, 2012).

PCT Notification Concerning Transmittal of International Preliminary Report on Patentability (Chapter I of the Patent Cooperation Treaty) for PCT Counterpart Application No. PCT/US2011/051958, 6 pgs., (Mar. 28, 2013).

\* cited by examiner

FIG. 1B Three-terminal ballistic junction

FIG. 1A Two-terminal ballistic junction

FIG. 2B (TOP VIEW)

FIG. 2C

FIG. 2A (SIDE VIEW)

FIG. 7E

TWO- AND THREE-TERMINAL MOLECULAR ELECTRONIC DEVICES WITH BALLISTIC ELECTRON TRANSPORT

CROSS-REFERENCE TO RELATED APPLICATIONS

This patent application is a U.S. National Phase application under 35 U.S.C. §371 of International Application No. PCT/US2011/051958, filed Sep. 16, 2011, entitled TWO- AND THREE-TERMINAL MOLECULAR ELECTRONIC DEVICES WITH BALLISTIC ELECTRON TRANSPORT, which claims the benefit of U.S. Provisional Application No. 61/384,039, filed Sep. 17, 2010, the entire contents of which are hereby incorporated by reference herein.

TECHNICAL FIELD

Embodiments of the present invention are in the field of molecular electronic devices and, in particular, two- and three-terminal molecular electronic devices with ballistic electron transport.

BACKGROUND

The term "molecular electronics" has been used to describe phenomena or devices that include a molecule as a circuit element. The motivation for the field is the prospect of making extremely small (potentially one molecule) electronic components with a much wider range of functions than conventional semiconductor electronic devices. If molecular devices become practical, a wide variety of applications in microelectronics, computing, imaging and display technology and chemical sensing can be envisioned.

The large majority of proposed molecular electronic devices are based on the gold-thiol system (Au/thiol), in which organic mercaptans "self assemble" on a flat gold surface to form an ordered monomolecular layer. In many cases, scanning tunneling microscopy (STM) of the Au/thiol layer or of gold particles thereon reveal the electron transfer characteristics of the monolayer molecule. However, the Au/thiol system is not suitable for the manufacture of stable devices in a highly parallel fashion since the thiol molecules maintain some mobility on the Au surface and are sensitive to elevated temperatures.

An alternative approach involves placing a single layer of molecules between two metal or metal oxide surfaces using Langmuir-Blodgett technology. In these experiments, the current/voltage behavior of a layer of molecules may be obtained, with the current path extending through the molecule itself.

While the above experiments demonstrate certain characteristics of molecules as electronic components, they have severe disadvantages when considered for practical uses. First, the apparatus required is extremely complex and difficult to use, and so far has only been successfully implemented on a limited scale in very sophisticated laboratories. Second, both approaches result in films with unavoidable defects that limit both the size and lifetime of the devices. Third, the Au/thiol or Langmuir-Blodgett approaches to binding the molecule to two conductors generate large energy barriers that reduce current flow. In the former, the aliphatic molecules have large electron transfer barriers and the dipole formed between the gold surface and sulfur atom can decrease electronic coupling between conductor and molecule. The Langmuir-Blodgett approach often requires metal oxide films that purposely decouple the molecule from the conductor in terms of electronic interactions. When the molecule is electronically decoupled from the conductor, many potentially valuable applications of molecular electronics are prevented. In addition, Langmuir-Blodgett structures involve weak molecule-to-surface bonds, and are thermally quite fragile. Fourth, STM interrogates one or a few molecules at a time, so the massive parallelism inherent in microelectronic devices is difficult to conceive. These fundamental problems inherent in Au/thiol or Langmuir Blodgett devices prevent any conceivable practical application in the foreseeable future.

Thus, significant improvements are needed in the evolution of molecular electronic device technology.

SUMMARY

Embodiments of the present invention are in the field of molecular electronic devices and, in particular, two- and three-terminal molecular electronic devices with ballistic charge carrier transport.

In an embodiment, a two-terminal molecular electronic device includes a conductor1 layer/molecule1 layer/conductor2 layer junction, wherein the total thickness of the molecule1 layer and the conductor2 layer is less than or approximately equal to the mean free path of a carrier traveling in the two layers, and wherein ballistic transport can occur for some fraction of a plurality of carriers in the two layers.

In another embodiment, a three-terminal molecular electronic device includes a conductor1 layer/molecule1 layer/conductor2 layer/molecule2 layer/conductor3 layer junction, wherein the total thickness of the molecule1 layer, the conductor2 layer, and the molecule2 layer is less than or approximately equal to the mean free path of a carrier traveling in the three layers, and wherein ballistic transport can occur for some fraction of a plurality of carriers in the three layers.

In another embodiment, a three-terminal molecular electronic device includes a conductor1 layer/molecule1 layer/conductor2 layer/non-molecular active transport layer/conductor3 layer junction, wherein the total thickness of the molecule1 layer, the conductor2 layer, and the non-molecular active transport layer is less than or approximately equal to the mean free path of a carrier traveling in the three layers, and wherein ballistic transport can occur for some fraction of a plurality of carriers in the three layers.

BRIEF DESCRIPTION OF THE DRAWINGS

FIG. 1 illustrates a schematic diagram representing (A) a two-terminal ballistic junction and (B) a three-terminal ballistic junction, in accordance with an embodiment of the present invention.

FIG. 4 illustrates (A) a side-view schematic of a three-terminal ballistic junction of the type conductor1/molecule1/conductor2/molecule2/conductor3, containing azobenzene and polythiophene layers, while (B) is a photomicrograph of a top view of the junction of A, showing contacts to Emitter (PPF), Base (Cu) and Collector (Au), in accordance with an embodiment of the present invention.

FIG. 5 illustrates (A) a circuit schematic for a three-channel monitoring of a three-terminal ballistic junction, for the case where Cu and Au are both biased at V=0 volts, while (B-E) are plots showing current and voltage characteristics of the terminals during operation, in accordance with an embodiment of the present invention.

FIG. 6 illustrates (A) a schematic of a three-terminal ballistic junction with resonant tunneling in the second molecular layer and (B) a plot of hypothetical current-voltage response of such a ballistic junction, in accordance with an embodiment of the present invention.

FIG. 7 illustrates (A) a schematic of the general structure of the device 100B of FIG. 1, (B) is a plot of the corresponding energy levels A, (C) is a diagram of a lowest unoccupied molecular orbital (LUMO) of a second molecule resonant with the tunneling electron, (D) is a diagram showing the case of a second layer composed of a semiconductor (CB=conduction band, VB=valence band), and (E) is a diagram of a semimetal with a finite density of states in the relevant energy range, in accordance with an embodiment of the present invention.

DETAILED DESCRIPTION

Two- and three-terminal molecular electronic devices with ballistic carrier transport generated via quantum mechanical tunneling or energy level matching are described herein. The ballistic, or scattering-free regime, is distinct from ohmic conduction in that device operations can be performed prior to charge carrier scattering. Ballistic carriers have a characteristic "mean free path" which indicates the distance the carrier can travel through a device without scattering at interfaces or within materials comprising the device. In the following description, numerous specific details are set forth, such as specific molecular layer compositions and device arrangements, in order to provide a thorough understanding of embodiments of the present invention. It will be apparent to one skilled in the art that embodiments of the present invention may be practiced without these specific details. In other instances, well-known processing or fabrication techniques, such as metal or dielectric layer patterning techniques, are not described in detail in order to not unnecessarily obscure embodiments of the present invention. Furthermore, it is to be understood that the various embodiments shown in the Figures are illustrative representations and are not necessarily drawn to scale.

Disclosed herein are two- and three-terminal molecular electronic devices. In one embodiment, a two-terminal molecular electronic device is provided. The device includes a conductor1 layer/molecule1 layer/conductor2 layer junction, wherein the total thickness of the molecule1 layer and the conductor2 layers is less than or approximately equal to the mean free path of a charge carrier travelling through the layers, and wherein ballistic transport can occur for some fraction of a plurality of charge carriers in the layers. Ballistic carriers traverse through molecule1 and conductor2 without scattering in the layers themselves or at their interface.

In another embodiment, a three-terminal molecular electronic device is provided. The device includes a conductor1 layer/molecule1 layer/conductor2 layer/molecule2 layer/conductor3 layer junction, wherein the total thickness of the molecule1 layer, the conductor2 layer, and the molecule2 layer is less than or approximately equal to the mean free path of a carrier in the layers, and wherein ballistic transport can occur for some fraction of a plurality of carriers in the layers. The molecular layers represent the active transport layers. In an embodiment, one or more of the active transport layers is an inorganic material, that is, one or more of the molecular layers depicted in FIG. 1 is replaced by an inorganic material. In one such embodiment, however, the device must include at least one molecular layer. For examples of such embodiments, see FIG. 7, described below.

A two terminal molecular junction consists of a molecular layer between two conductors, and shows a nonlinear response of current vs. voltage, as has been described in U.S. Pat. No. 7,042,006 and shown as item 260 in FIG. 2 described below. Also described therein is a three-terminal device having two molecular layers staggered between three conductor or contact layers. In accordance with an embodiment of the present invention, such a two-terminal or three-terminal device is fabricated and operated such that carrier transport therein is "ballistic." In one embodiment, the term ballistic is used to mean that the electrons (or holes) do not scatter during transport through the molecules between conducting contacts. Ballistic transport is fast, operates without conventional resistance, and typically does not generate heat. In addition, if an upper contact and a corresponding molecular layer are thin compared to the mean free path of carriers, ballistic transport occurs from a bottom contact all the way through to the top surface of the upper contact.

Molecular devices described herein have at least one molecular layer covalently bonded to a conductor layer. In one such embodiment, such covalent bonding may be irreversible. The irreversibility is thermal in the sense that the bond will remain intact up to temperatures of at least 300 degrees Celsius, as distinguished from a labile gold-thiol bond. Such an Au—S bond may be considered "covalent" but is also "labile," making it temperature-sensitive. The irreversible bonding considered for embodiments herein may be included in order to tolerate elevated operating and fabrication temperatures. A molecular layer may include, in an embodiment, discrete molecules, such as azobenzene and fluorene, and, in another embodiment, conducting polymers, such as polythiophene. For illustrative purposes, the concept of a relationship between mean free path and ballistic transport is seen in copper. For example, the accepted mean free path of electrons in copper is 40 nanometers, so electronic conduction in bulk Cu proceeds by a series of linear trajectories between scattering events. (See, e.g., Ref. 15.) Thus, electrons should traverse an average of about 40 nanometers of copper without scattering, therefore without resistance or heat generation.

In an embodiment, addition of a layer of a luminescent material onto the surface of the upper contact of a two-terminal device permit generation of light by the hot electrons exiting the upper contact, or alternatively, the hot electrons are injected into a vacuum and collected externally. In another embodiment, addition of a second molecular layer onto the upper contact of a two-terminal device followed by addition of a third conductive contact (top contact) provides a "three-terminal" device, with an intermediate conducting layer (e.g., copper) disposed between two molecular layers.

With respect to a three-terminal device, ballistic transport may occur from a bottom to a top contact, through the two molecular layers and the middle contact. For example, in an embodiment, ballistic transport occurs if the total thickness of the two molecular layers and the middle contact is less than or approximately equal to the mean free path of the electron (or hole). A three-terminal device may permit control of the ballistic current in various configurations (including, e.g., amplifier circuits), with low resistance, low heat generation, and fast response. In one embodiment, applications of such a three-terminal device include light generation, fabrication of display devices, fast yet low power amplifiers, and ultra-fast logic circuits.

It is noted that three-terminal devices exhibiting ballistic transport have been reported for inorganic semiconductor and metal oxide layers disposed between conducting contacts. (See, e.g., U.S. Pat. No. 7,173,275 and references therein, U.S. Pat. Nos. 4,833,517 and 5,712,491, and Heiblum, IBM J. Res. and Devel, 34, 530 (1990) and Phys. Rev. Lett. 55, 2200 (1985).) However, these devices generally operate at low temperature and have low ballistic efficiency. By contrast, in accordance with an embodiment of the present invention, the use of at least one molecular layer rather than only oxide or semiconductor layers permits the fabrication of much thinner layers, tunable energy levels, and possibly higher ballistic efficiency.

In an aspect of the present invention, two-terminal and three-terminal molecular devices may be fabricated to have ballistic junctions. For example, FIG. 1 illustrates a schematic diagram representing (FIG. 1A) a two-terminal ballistic junction and (FIG. 1B) a three-terminal ballistic junction, in accordance with an embodiment of the present invention.

Figure 1A:
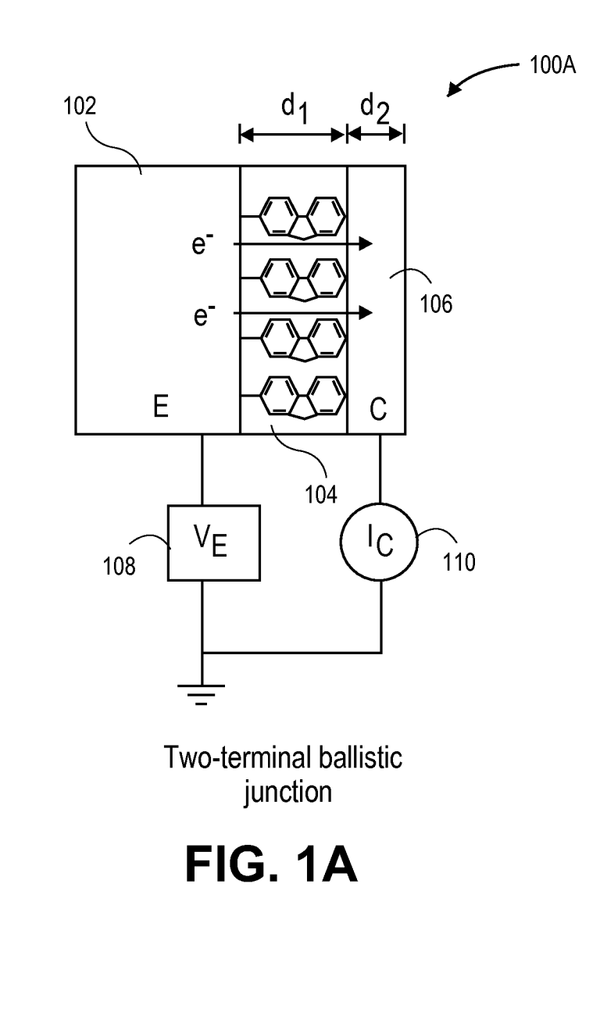
Figure 1B:
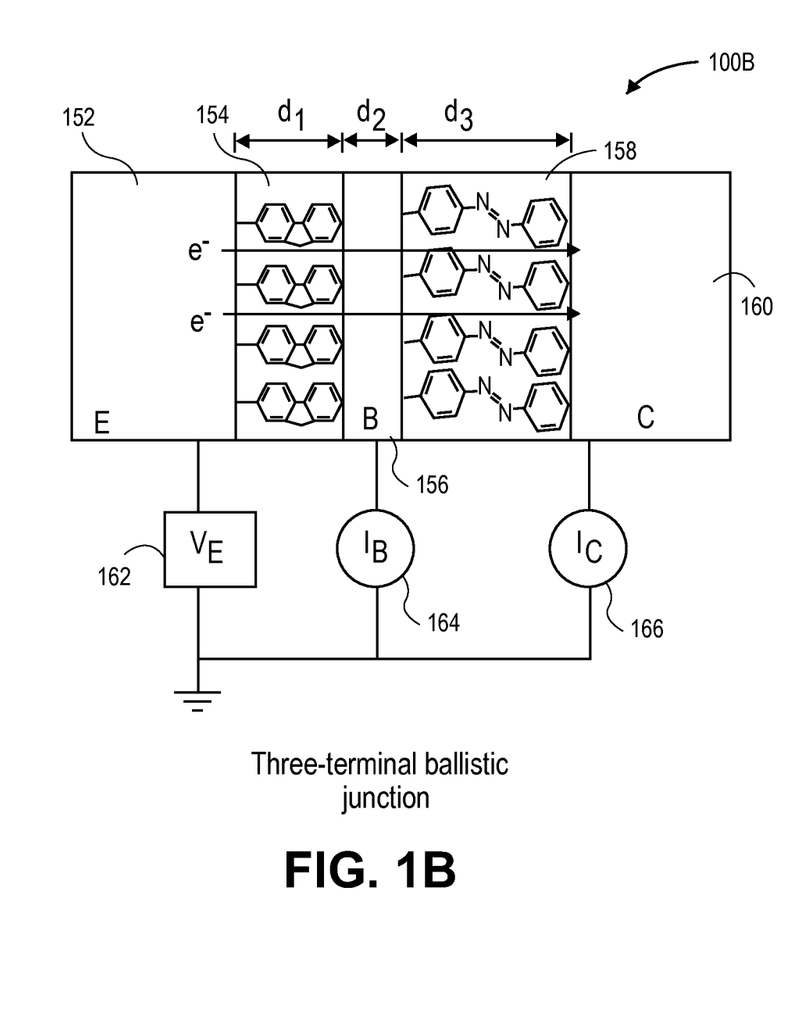

Referring to FIG. 1, a two-terminal molecular device 100A includes a first conductor layer 102, a molecular layer 104, and a second conductor layer 106. When a voltage 108 is applied across the first conductor layer 102, first conductor layer 102 acts as an emitter layer (E) of electrons (or holes). A current 110 can be measured at the second conductor layer 106, which acts as a collector layer (C). Molecular layer 104 has a thickness $d_1$ and second conductor layer 106 has a thickness $d_2$.

In an embodiment, the two-terminal device includes an electronically conducting emitter layer (E), made from, for example, carbon, conducting polymer, or metal (or possibly a conducting metallic compound such as titanium nitride), and a collector layer (C) also made from a conductor. In one embodiment, the molecular layer 104 is deposited on the emitter layer to provide a thin film (e.g., $d_1$ is approximately in the range of 1-20 nanometers) composed of molecules such as, but not limited to, biphenyl, azobenzene, alkanes, etc. In one embodiment, the collector layer is also a thin layer (e.g., $d_2$ is approximately in the range of 10-100 nanometers) of a metal or conducting carbon in electrical contact with the molecular layer 104. In an embodiment, two-terminal molecular device 100A may be fabricated by known methods. (See, e.g., Refs. 1-14.) In an embodiment, notable characteristics of the two-terminal molecular device 100A include nonlinear resistance, weak temperature dependence, and strong dependence on the structure and thickness of the molecular layer 104. In an embodiment, second conductor layer 106 of the two-terminal molecular electronic device 100A is composed of a semiconductor material, such as amorphous silicon.

In accordance with an embodiment of the present invention, the thickness of the molecular layer 104 is less than or approximately equal to the mean free path of electrons in the molecular layer 104. In one embodiment, if the thickness of the molecular layer 104 is less than the mean free path of electrons in the molecular layer 104, then ballistic transport of carriers can be achieved. For example, experimental evidence shows that for layers of a few tens of nanometers, electrons (or holes) do not scatter, meaning the transport is ballistic. In an embodiment, ballistic transport is characterized by the absence of resistance, no temperature dependence, minimal heat generation, and fast response time. Furthermore, in an embodiment, if the collector layer 106 (C in FIG. 1, device 100A) is fabricated thin enough (e.g., less than approximately 100 nanometers), so that the total thickness of the molecular layer and collector ($d_1+d_2$) is short compared to the carrier mean free path, then electrons propagate through the molecular layer and the collector ballistically.

Figure 2A:
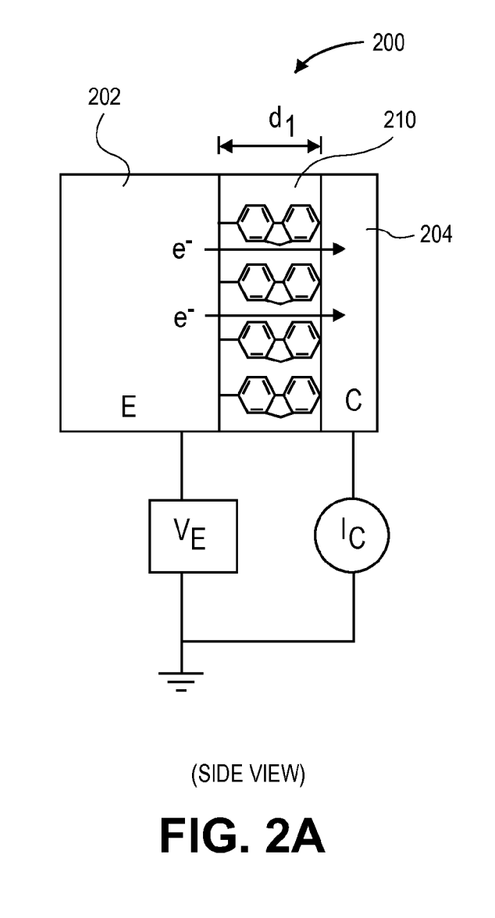
FIG. 2 illustrates a practical manifestation of a two-terminal ballistic junction containing a monolayer of fluorene as the molecular layer, in accordance with an embodiment of the present invention.
Figure 2B:
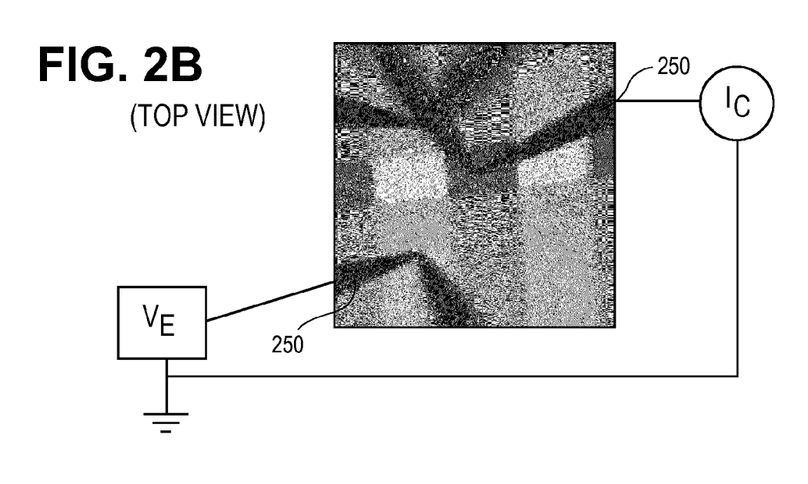
Figure 2C:
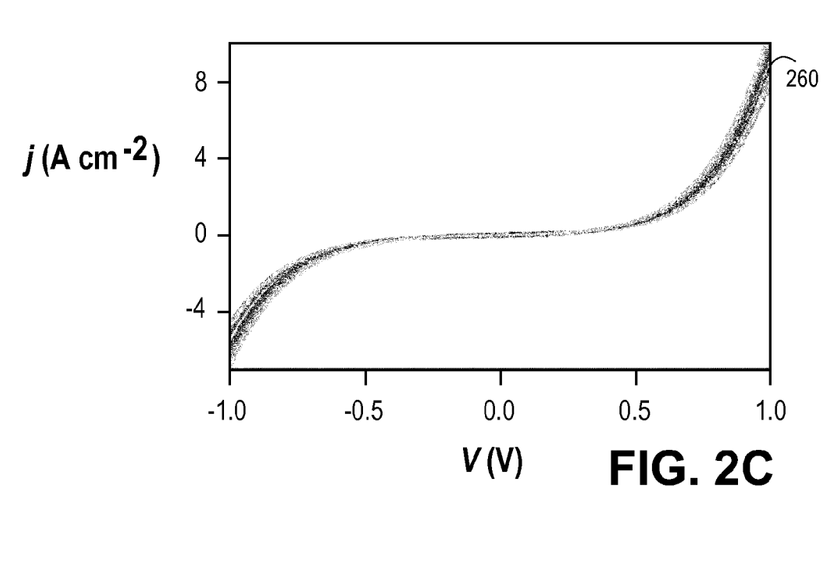

FIG. 2 illustrates a practical manifestation of a two-terminal ballistic junction 200 containing a monolayer of fluorene 210 as the molecular layer, in accordance with an embodiment of the present invention. The emitter (E) 202 is a pyrolyzed photoresist film (PPF) consisting of conducting $sp^2$ hybridized carbon similar to glassy carbon, and the collector (C) 204 is vapor deposited copper. FIG. 2A is a side view schematic of the junction structure 200, FIG. 2B is a top view photomicrograph with contact probes 250 shown, and FIG. 2C is an overlay of multiple current/voltage curves for such a two-terminal ballistic junction with an area of approximately 0.003 square centimeters.

In accordance with an embodiment of the present invention, carrier transport through the two-terminal device 200 depicted in FIG. 2 is ballistic, with the current/voltage response 260 occurring with minimal scattering. Although structurally similar devices have been reported as "tunnel junctions" (often based on $Al_2O_3$ between two conductors, e.g., see Refs. 16-18), a unique feature of the current devices is the proximity in energy of the molecular orbitals of each molecule in the molecular layer 210 to the Fermi level of the contacts 202 and 204, and the wide variety of possible energy levels available from organic chemical structures. Combined with the short molecular dimensions (e.g., approximately in the range of 1-10 nanometers), in one embodiment, the proximity of energies leads to high tunneling currents and efficient generation of energetic electrons (or holes). In specific embodiments, a wide range of aromatic and aliphatic molecules are available for the molecular layers, and they are chosen on the basis of their energy levels and compatibility with materials and processing used to fabricate corresponding devices. Non-molecular materials, such as semiconductors and semi-metals, may also be used as the second active transport layer.

Figure 3:
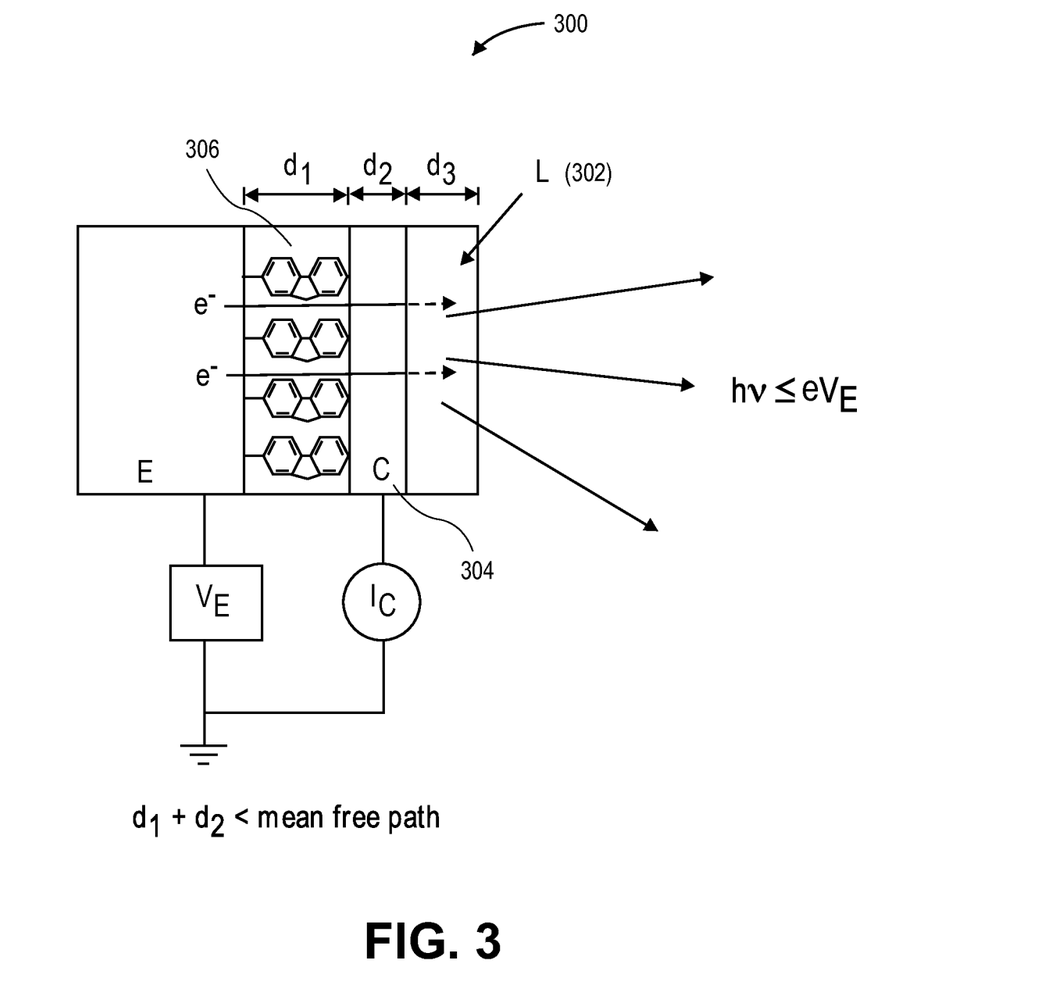
FIG. 3 is a schematic (side view) of a two-terminal junction modified to include a layer of luminescent material (L) deposited on the surface of the collector (C), in accordance with an embodiment of the present invention.

In another aspect of the present invention, if the collector layer 106 (C in FIG. 1, device 100A) and an additional layer thereon are fabricated thin enough so that the total thickness of the molecular layer and collector ($d_1+d_2$) as well as the thickness of the additional layer is shorter than or approximately equal to the carrier mean free path, then electrons may propagate through the molecular layer, the collector, and the additional layer ballistically. For example, FIG. 3 is a schematic (side view) of a two-terminal junction 300 modified to include a layer of luminescent material (L) 302 deposited on the surface of the collector (C) 304, in accordance with an embodiment of the present invention. In an alternative embodiment (not shown), a luminescent material is included in the material layer of collector (C) layer, e.g., as a blend or mixture. In another alternative embodiment (not shown), the collector (C) is itself composed of a luminescent material with properties suitable to act both as a collector and as a source of luminescence.

In an embodiment, if ballistic electrons have sufficient energy, they can excite luminescence in (L) 302, to generate light. For example, referring to FIG. 3, in one embodiment, electrons (e⁻) may exit the collector material 304 and enter either a vacuum or a layer of luminescent material 302. In a specific embodiment, if a vacuum, the electron may be collected by a nearby electrode, or its energy may be measured by a hemispherical analyzer. These "escaped" electrons may provide information about the nature of the ballistic process or the composition of the collector material and its surface. In another specific embodiment, in the case of a luminescent material 302, the ballistic electron may create an excited state which emits light, with the minimum wavelength determined by the energy of the electron. Such light generation may be efficient and tunable with respect to color, potentially leading to attractive devices for area lighting and display applications, as noted below. In an embodiment, if a molecular layer 306 (with a thickness $d_1$), the collector layer 304 (with a thickness $d_2$), and the luminescent material 302 (with a thickness $d_3$) are fabricated so that the total thickness of the molecular layer and the collector layer ($d_1+d_2$) is shorter than or approximately equal to the carrier mean free path for those layers, then electrons propagate through the molecular layer and the collector layer ballistically. It is to be understood that the carrier need not traverse the thickness $d_3$ of the luminescent material ballistically.

Referring again to FIG. 1, a three-terminal molecular device 100B includes a first conductor layer 152, a first molecular layer 154, a second conductor layer 156, a second molecular layer 158, and a third conductor layer 160. When a voltage 162 is applied across the first conductor layer 152, first conductor layer 152 acts as an emitter layer (E) of electrons (or holes). A first current 164 can be measured at the second conductor layer 156, which acts as a base layer (B). A second current 166 can be measured at the third conductor layer 160, which acts as a collector layer (C). First molecular layer 154 has a thickness $d_1$, second conductor layer 156 has a thickness $d_2$, and second molecular layer 158 has a thickness $d_3$.

In accordance with an embodiment of the present invention, the first molecular layer 154 (with a thickness $d_1$), second conductor layer 156 (with a thickness $d_2$), and the second molecular layer 158 (with a thickness $d_3$) are fabricated thin enough so that the total thickness of the first molecular layer, the second conductor layer, and the second molecular layer ($d_1+d_2+d_3$) is short compared to the carrier mean free path. In that embodiment, electrons propagate through the first molecular layer, the second conductor layer, and the second molecular layer ballistically. In a specific embodiment, the base thickness, $d_2$, is similar to the molecular layer thicknesses, which are approximately in the range of 1-100 nanometers.

In an embodiment, the three-terminal device 100B is fabricated by adding a second molecular layer 158 (with a thickness $d_3$) by spin coating or chemical bonding via diazonium reduction, or alternative bonding chemistry. The junction area may be defined by a patterned photoresist, if necessary, before adding the molecular layer 158. In one embodiment, the third contact (C) is applied by vapor deposition. Note that the designations E (emitter), B (base), and C (collector) are familiar terms in bipolar transistors, but it is important to understand that the device 100B may have very different physical principles from conventional transistors.

Figure 4A:
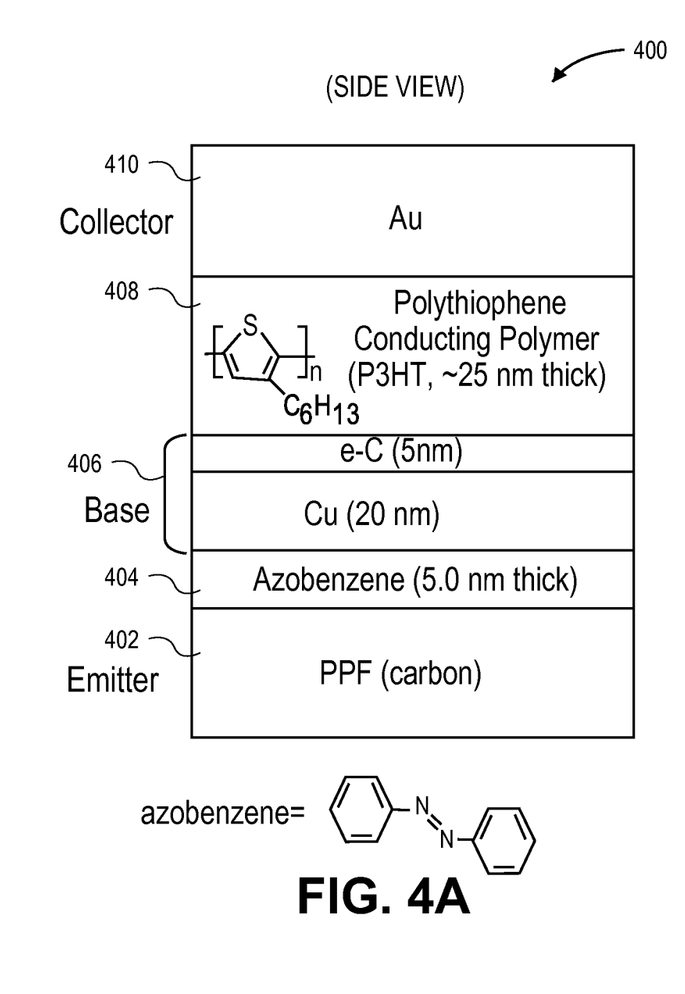
Figure 4B:
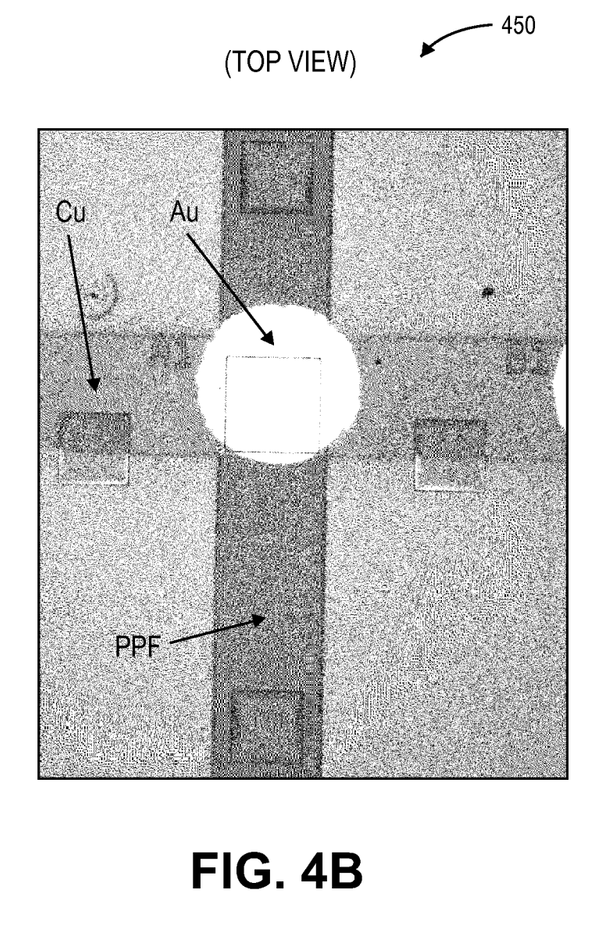

As an example, FIG. 4A illustrates a side-view schematic of a three-terminal ballistic junction 400 of the type conductor1 (402)/molecule1 (404)/conductor2 (406)/molecule2 (408)/conductor3 (410), containing azobenzene and polythiophene layers. FIG. 4B is a photomicrograph 450 of a top view of the junction 400 of FIG. 4A, showing contacts to the emitter (PPF), base (Cu) and collector (Au), in accordance with an embodiment of the present invention. Thus, in an embodiment, to fabricate a three-terminal device, a second molecular layer and a third conducting contact are added to a two-terminal device, in this case consisting of polythiophene and gold, respectively. In one embodiment, typical thicknesses are shown in FIG. 4, with "e-C" being a 5 nm film of conducting carbon deposited by electron beam evaporation on top of the copper. Whatever the composition of the molecular layers and conductors, the "active" thickness ($d_1+d_2+d_3$) of device 100B in FIG. 1 is less than or approximately equal to the mean free path of carriers (electrons or holes) in those same layers. Referring again to in FIG. 4B, a photomicrograph (top view) of the finished 3-terminal device is shown, with the central square being the junction region (400 microns×400 microns). Note that, in an embodiment, the lower three layers are identical to the three layers of a two-terminal device, and carrier transport should be ballistic at least in this region.

In one embodiment, a three-terminal device includes a conductor1 layer/molecule1 layer/conductor2 layer/molecule2 layer/conductor3 layer junction, where the molecule1 layer is not covalently bonded to the conductor2 layer. In one embodiment, one or more of the conductor layers is composed of a material such as, but not limited to, carbon, conducting polymers, metals, or conducting metallic compounds such as TiO or TiN.

In one embodiment, a three-terminal device includes a conductor1 layer/molecule1 layer/conductor2 layer/molecule2 layer/conductor3 layer junction, where the molecule2 layer is not covalently bonded to the conductor2 layer or the conductor3 layer, or both. In one embodiment, one or more of the conductor layers includes a material such as, but not limited to, carbon, conducting polymers, metals, or conducting metallic compounds such as TiO or TiN.

In one embodiment, a three-terminal device includes a conductor1 layer/molecule1 layer/conductor2 layer/molecule2 layer/conductor3 layer junction, where the conductor2 layer comprises a semiconductor material, such as amorphous silicon.

Figure 5A:
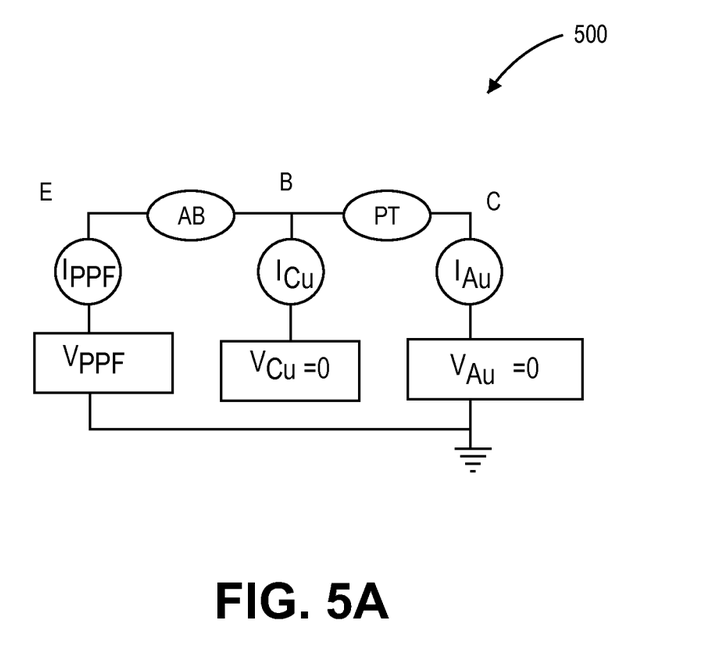
Figure 5B:
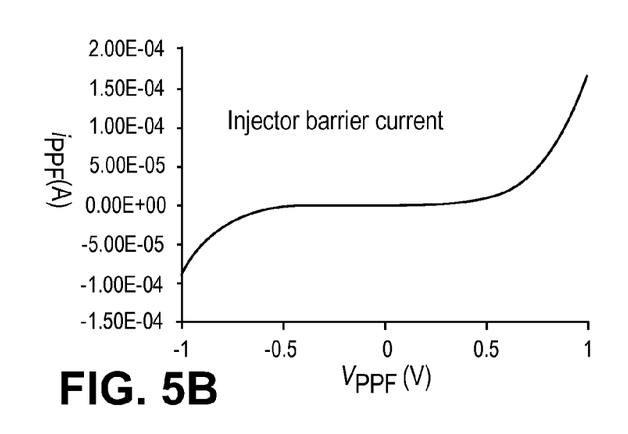
Figures 5C, 5E:
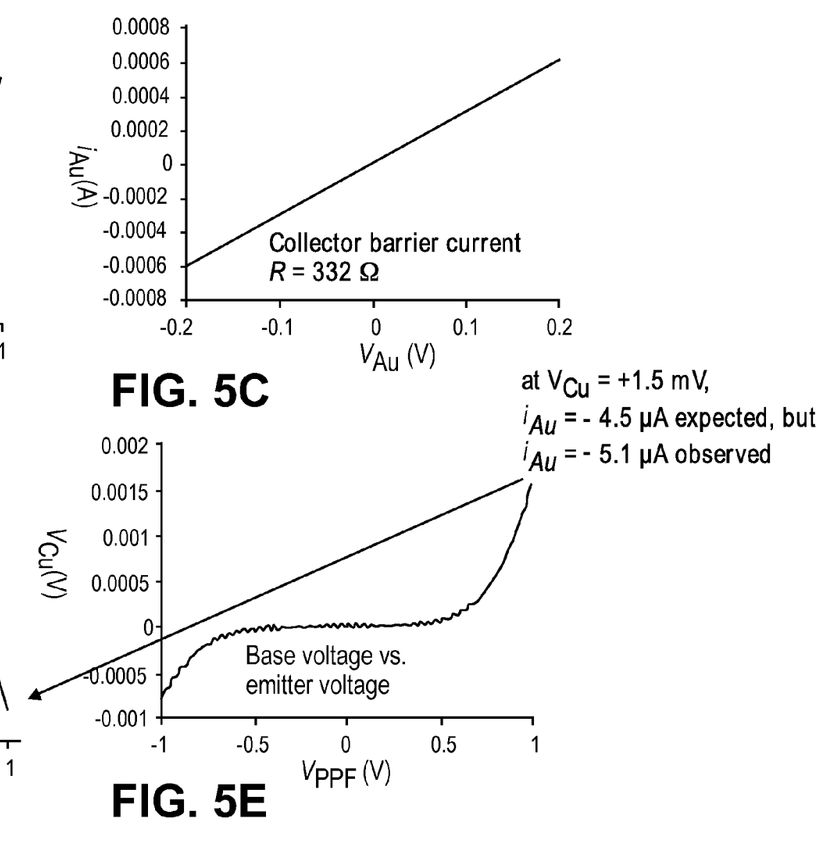
Figure 5D:
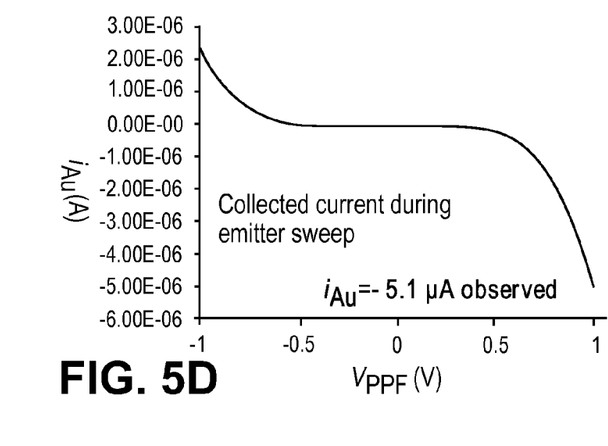

FIG. 5A illustrates a circuit schematic 500 for three-channel monitoring of a three-terminal ballistic junction, for the case where Cu and Au are both biased at V=0 volts, while FIG. 5B is a plot of current at the emitter terminal in response to a voltage sweep of $V_{PPF}$ relative to ground potential, in accordance with an embodiment of the present invention. FIG. 5C shows the collector current in response to a voltage sweep of the Au collector with respect to ground potential, where the Cu and PPF are both biased at V=0 volts, indicating a resistance of 332 ohms for the base-collector junction. FIG. 5D shows the collector current in response to a voltage sweep of PPF for the case where Cu and Au are both biased at V=0 volts. FIG. 5E shows the voltage of the base terminal as a function of the emitter voltage, indicating that the base is not at the desired V=0 potential, but differs slightly due to resistance errors in the base material. Simple calculations with Ohm's law shows that for the observed base voltage of 1.5 mV (when $V_{PPF}$=+1 V), −4.5 μA of current are expected to flow across the collector barrier (332 ohms). However, as shown in FIG. 5D, −5.1 μA of current are observed when $V_{PPF}$=+1 V, indicating that up to 12% of the observed collector ($i_{Au}$) current is non-classical ballistic current, and that 0.38% of the observed emitter current ($i_{PPF}$) is non-classical ballistic current. Referring to circuit schematic FIG. 5A, "AB" represents an azobenzene layer, 5 nanometers thick, and "PT" is a poly(3-hexylthiophene), approximately 15 nanometers thick. Referring to schematic FIG. 5A, circles represent ammeters and rectangles are voltage sources. Polarity of the Cu and Au currents appear opposite that of the PPF current due to the nature of the instrument. In accordance with an embodiment of the present invention, the extent of the ballistic nature of the three-terminal ballistic junction is approximately in the range of a fraction of 1% of the carriers to ~15% of the carriers. In a more specific embodiment, the extent of the ballistic nature of the junction is in the range of approximately 5 to 15%. It should be understood that 15% does not represent an upper limit, and that the fraction of carriers traveling ballistically may be much higher, up to 100%.

The remaining carriers are presumably scattered in the Cu layer, and generate $i_{Cu}$ by conventional conduction within the Cu layer. Note that the signs of $i_{PPF}$ and $i_{Au}$ are opposite that of $i_{PPF}$ simply because of the polarity of the current measurement. Carriers should be viewed as leaving the emitter, then either exiting the Cu (base), or traversing ballistically to the Au (collector). In principle, in an embodiment, the carriers could continue past the Au ballistically, but are prevented from doing so in the example shown because they are not sufficiently energetic to overcome the work function of Au.

In accordance with an embodiment of the present invention, applications of a two-terminal ballistic junction include incorporation as an electronic circuit element. For example, in one embodiment, the two-terminal device is a nonlinear conductor which does not exhibit conventional resistance, and therefore exhibits minimal heat generation. It may operate at low temperature (e.g., less than approximately 5 K), and may have a high frequency response. For example, in a specific embodiment, the transit time of a free electron across a 10 nm thick junction under a 1 V bias is 34 femtoseconds, corresponding to a maximum frequency of $>10^{13}$ Hz. In a particular embodiment, the actual limit is even higher due to a low, nonclassical effective electron mass resulting from electron delocalization. A major problem of existing microelectronics can be heat generation in high density integrated circuits. In an embodiment, this problem is circumvented if two- or three-terminal devices with useful electronic properties are fabricated to exhibit essentially or only ballistic transport. Furthermore, in one embodiment, such ballistic devices operate with much lower power consumption than conventional resistors and transistors.

In another embodiment, applications of a two-terminal ballistic junction include use as a hot carrier generator. For example, in one embodiment, since ballistic transport through all three layers of a three-terminal device ($d_1+d_2+d_3$) is possible, as described above, two-terminal devices of the type conductor1/molecule1/conductor2 also exhibit ballistic transport through the second conducting layer if $d_1+d_2$ is less than or approximately equal to the carrier mean free path. In a specific embodiment, such "hot electrons" may be injected into a vacuum (field emission) and detected with a third electrode. In another specific embodiment, such a device exhibits field emission at low voltage, once the applied bias exceeds the work function of "conductor2." Field emission may be highly sought-after for use in display devices based on electron impact with luminescent materials. Furthermore, in an embodiment, hot electrons carry information about surface and bulk composition of conductor2, thus providing a method for chemical characterization of the materials involved. For example, in a particular embodiment, adsorption of molecules to the conductor2 surface modulates electron emission, thus providing a method of chemical detection of adsorbed molecules.

In another embodiment, applications of a two-terminal ballistic junction include use as a large area light source. For example, in one embodiment, a luminescent material is deposited on conductor2 and is excited by the ballistic electrons, emitting light. In a specific embodiment, a mixture of luminescent materials is formulated to generate white light, possibly over a large area. The efficiency may be high and the manufacturing cost low, thus competing favorably with light emitting diodes. In a particular embodiment, large panels (e.g., approximately 1 square meter or larger) are fabricated to provide uniform light output, in various colors if desired.

In another embodiment, applications of a two-terminal ballistic junction include use as display devices based on ballistic electrons. For example, in one embodiment, since the color of the emitted light is controlled in part by the ballistic electron energy (and therefore the applied bias, where the shortest possible wavelength ($\lambda_s$) of the emitted light is determined by $\lambda_s = h \times c/(e \times V_{bias}) \approx 1240$ eV·nm/(e·$V_{bias}$), where h is Planck's constant, c is the speed of light, e is the elementary charge and $V_{bias}$ is the bias voltage applied across the junction), it is possible to make light-emitting junctions with emission wavelengths in the submicrometer to micrometer range. Arrays of such devices may be used to fabricate a display device similar to today's computer monitors. However, in a specific embodiment, the power consumption and cost is much lower than existing devices due to the straightforward construction.

In accordance with an embodiment of the present invention, applications of a three-terminal ballistic junction include use as three-terminal electronic components. For example, as is the case with the two-terminal ballistic device, transport without scattering has been demonstrated for three-terminal junctions with active thicknesses ($d_1+d_2+d_3$) totaling less than the mean free path of the carriers (electrons or holes), as described above. Minimal heat generation and power consumption may be two immediate consequences. In an embodiment, however, a more fundamental consequence is the possibility that the two molecular layers and the intermediate conducting "base" comprise one quantum mechanical system, with strong electronic coupling between the two molecular layers. Thus, in one embodiment, an electron near the conductor1/molecule1 interface has a finite quantum-mechanical probability of appearing at the molecule2/conductor3 interface, hence rapid, ballistic transport occurs. Such transport may have no precedent in conventional microelectronics and, in a specific embodiment, is amenable to manipulation by changes in molecular structure. Since the transit time of an electron across approximately 50 nanometers under 1 volt bias is <1 picosecond, high frequency operation above 1000 gigahertz (1 terahertz) may be possible.

In another embodiment, applications of a three-terminal ballistic junction include "gated" conductance in three-terminal ballistic junctions. For example, in one embodiment, the existence of the third terminal permits control of ballistic current by an applied stimulus, such as a DC or AC voltage applied to the "base" (conductor2). Gating is the basis of conventional tube and transistor amplifiers, and is widely used in today's microelectronic devices. The factors which control gating of ballistic junctions are currently unknown but, in one embodiment, it is possible to control gating by the choice of molecules and conductor (contact) materials.

Figure 6A:
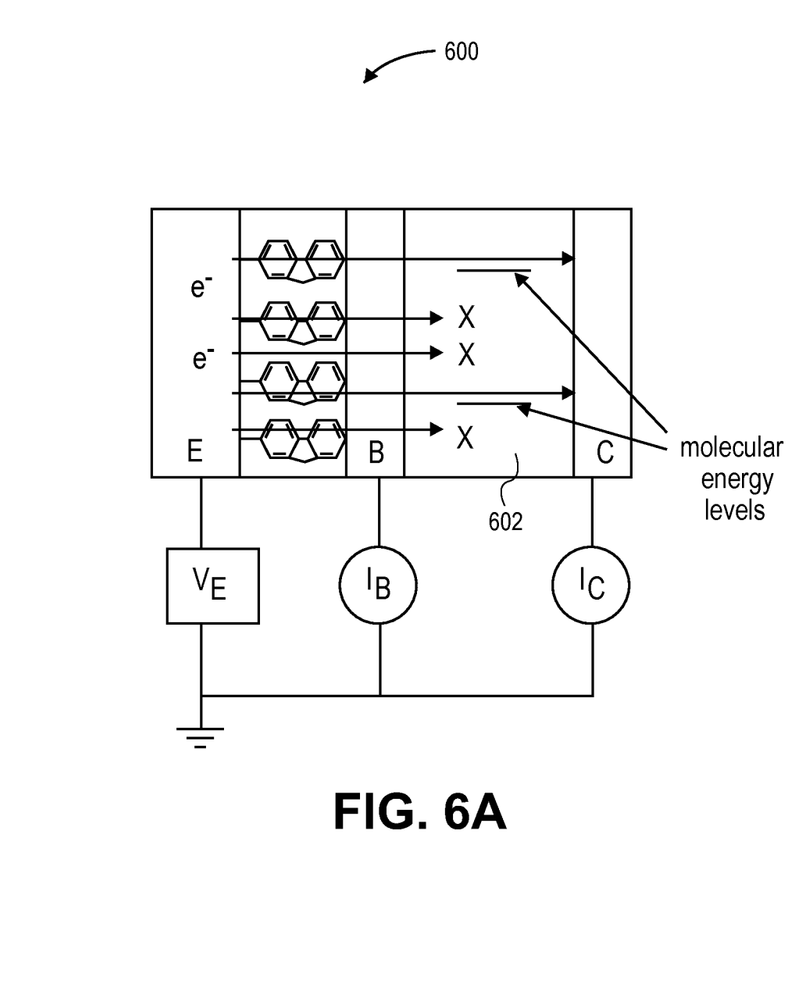
Figure 6B:
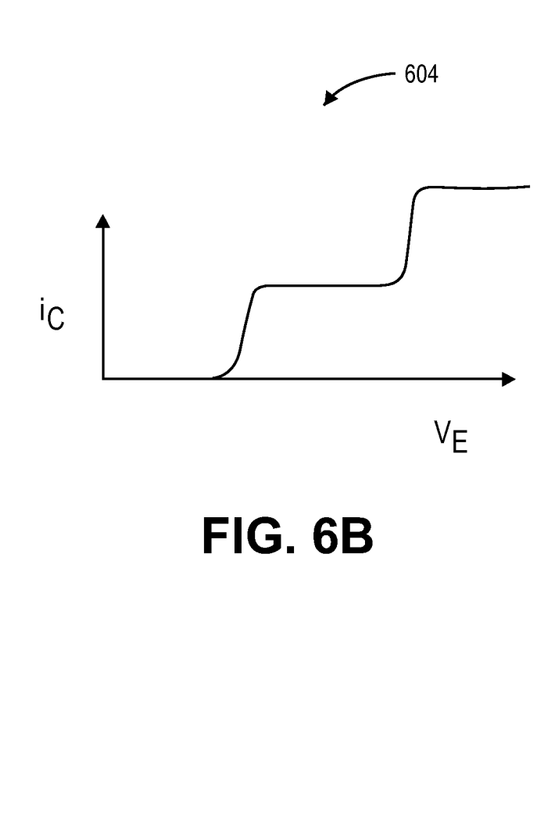

FIG. 6A illustrates a schematic 600 of a three-terminal ballistic junction with resonant tunneling in the second molecular layer 602 and FIG. 6B is a plot 604 of hypothetical current-voltage response of such a ballistic junction, in accordance with an embodiment of the present invention. In one embodiment, referring to FIGS. 6A and 6B, greatly enhanced transport is exhibited when the E-B bias produces electrons (or holes) with energies equal to a molecular orbital in the second molecular layer. Thus, "resonant" transport in the second molecular layer may be achieved. For example, in one embodiment, electrons with energies equal to one of the molecular orbitals in the second molecular layer have enhanced transport across the second layer. As $V_E$ is increased the ballistic electron energy increases, until it equals an orbital energy in the second layer. Since there is no bias across the second molecular layer, the orbital energies are not perturbed by an electric field. In one embodiment, such resonant transport is manifested by large increases in current at well defined voltages. In effect, resonant transport may be modulated by $V_E$, in a fashion similar to a field effect transistor, but with a very different underlying mechanism. In a specific embodiment, resonant transport is very sensitive to electron energy, so small changes in $V_E$ yield large changes in resulting current.

Figure 7A:
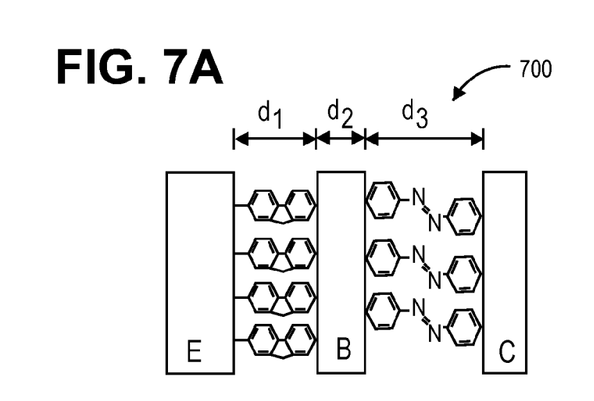
Figure 7B:
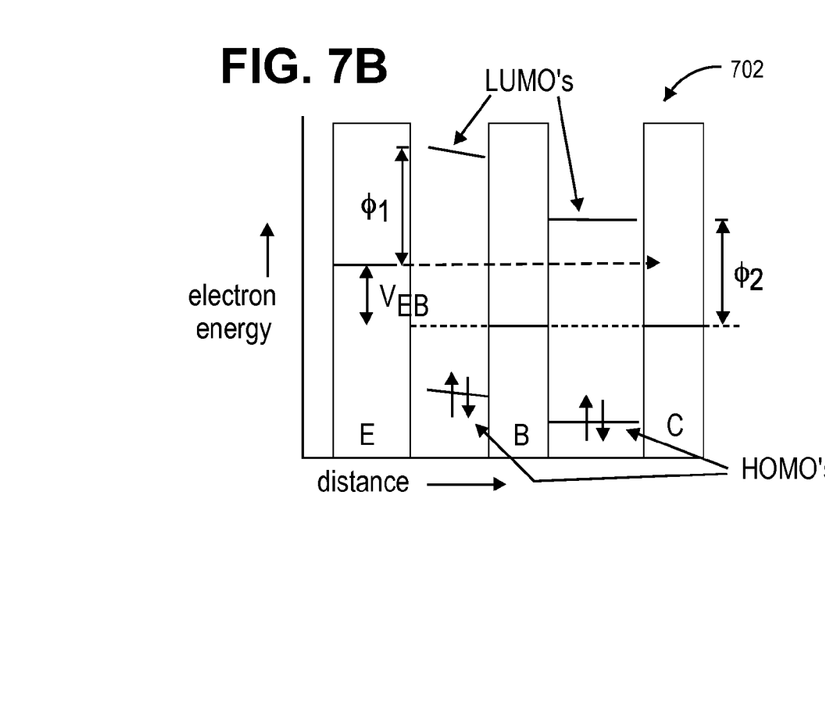
Figure 7C:
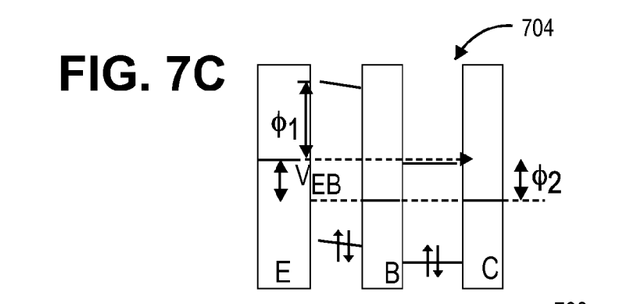
Figure 7D:
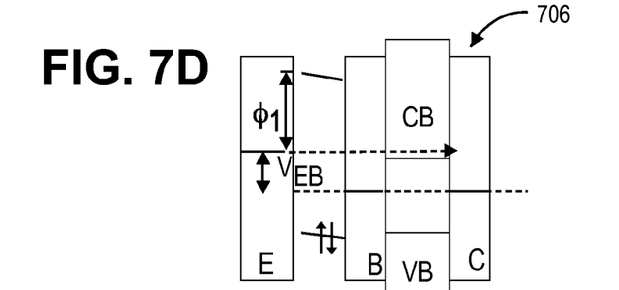
Figure 7E:
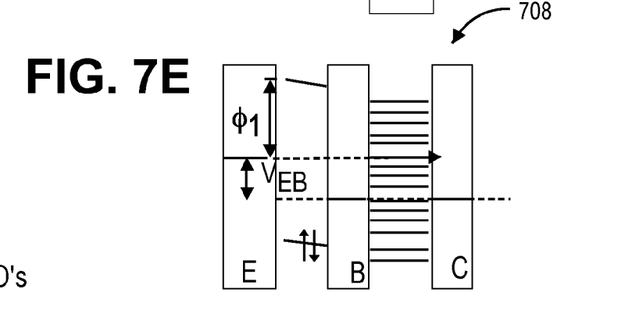

FIG. 7A illustrates a schematic 700 of the general structure (where the molecular species can be varied over a wide range of structures from those shown) of the device 100B of FIG. 1, FIG. 7B is a diagram 702 of the corresponding energy levels of the structure shown in FIG. 7A, FIG. 7C is a diagram 704 of a lowest unoccupied molecular orbital (LUMO) of a second molecule resonant with the tunneling electron, FIG. 7D is a diagram 706 showing the case of a second active transport layer composed of a semiconductor (CB=conduction band, VB=valence band), and FIG. 7E is a diagram 708 of a semi-metal with a finite density of states in the relevant energy range, in accordance with an embodiment of the present invention. Thus, FIGS. 7B-7E illustrate energy level diagrams for a three-terminal ballistic junction in various manifestations. For example, referring to diagram 702, horizontal lines in E, B, and C are the local Fermi levels, in the case where $V_B=V_C$. LUMO is the lowest unoccupied molecular orbital, which defines the energy barriers for electron tunneling in the first ($\phi_1$) and second ($\phi_2$) molecular layers. As the applied voltage between the emitter and the base, $V_{EB}$, is increased, electrons tunnel through the first tunneling barrier ($\phi_1$), then continue ballistically through the base and the second molecular layer.

Referring again to FIGS. 7A-7E, the importance of energy levels and composition of the second molecular layer, with the consequence of possibly great versatility of the three-terminal configuration, is illustrated. Panels A and B are the structure and energy levels of a device with different molecules in the two molecular layers. For electron tunneling, the lowest unoccupied molecular orbital (LUMO) determines the tunneling barrier, while the highest occupied molecular orbital (HOMO) determines the barrier for hole transport. In an embodiment, tunneling rates are determined by the biases on all three electrodes and the thicknesses of the molecular layers. The case shown in plot 702 is the "non-resonant" case, where the molecular orbital energies are not close to the Fermi levels of the electrodes. Diagram 704 illustrates the case of a LUMO in the second molecular layer equal to the energy of the hot electron leaving the base ($V_{EB}$), in which significant current enhancement is expected. As mentioned above, one of the active transport layers may be non-molecular. Diagram 706 depicts a semiconductor material (e.g., Si, $TiO_2$ or other conductive metal oxides, etc.) as the second active transport layer, which, in an embodiment, enhances current once the hot electron is in the conduction band energy range. Diagram 708 depicts a semi-metal (e.g., bismuth) as the second active transport layer, with a moderate but not continuous density of electronic states (versus a metal which is modeled as having a continuous density of electronic states). Diagrams 704, 706, and 708 describe cases in which resonant tunneling occur.

In an embodiment, by varying the composition and energy levels of the molecular layers, as well as the relative biases of the three electrodes, a variety of electronic behaviors is possible. An additional objective of variations in energy levels of the first and second molecular layer may be "negative differential resistance" related to resonant tunneling. In a specific embodiment, it is possible to select molecules with suitable orbitals to produce a peak-shaped current voltage curve.

In another embodiment, applications of a three-terminal ballistic junction include integration in or fabrication of logic circuits. For example, in one embodiment, a molecular ballistic transistor operates in a logic circuit, similar to the widely used transistors and diodes in computing applications. Gated operation may permit the three-terminal device to act as a switch, with high conductance "ON" state and a low conductance "OFF" state. This switching function underlies a large fraction of the microelectronic circuits used in today's microprocessors and digital logic. In a specific embodiment, using a three-terminal device with ballistic transport has the advantages of very little heat generation and/or very high speeds. Stated in more conventional terms, the $10^{-13}$ second transit times predicted for a ballistic molecular junction correspond to switching frequencies exceeding 1000 gigahertz. Furthermore, in another specific embodiment, an additional attractive feature of ballistic molecular devices is low-voltage, low-power operation, since transport is not diffusive and there is no p-n "built-in" field (approximately 0.7 volts) to overcome. Low voltage, ballistic operation may thus greatly extend battery life and conserve energy. U.S. Pat. No. 7,173,275 and references therein show several applications of three-terminal ballistic transistors fabricated without molecular layers, such as those described in embodiments of the present invention.

In an embodiment, applications of both a two-terminal and a three-terminal ballistic junction include the use of, and tailoring of, a wide range of molecules available for the molecular layers. For example, in one embodiment, whether aromatic or aliphatic, whether chemically sensitive or inert, the energy levels and thicknesses of the molecular layers profoundly influence the electronic properties of the devices. Molecular structures may be designed to exhibit particular electronic properties, or to be made compatible with commercial processing and materials.

Thus, two- and three-terminal molecular electronic devices with ballistic charge carrier transport have been disclosed. It is to be understood that higher order terminal molecular devices, e.g., 4-terminal and greater, either on their own or as broader devices with two- or three-terminal molecular electronic device portions, are considered within the spirit and scope of embodiments of the present invention. Devices described herein may find applications in resonant tunneling diodes, gated operations, high-frequency switching, logic circuits, light-emitting devices, chemical detection, or materials characterization.

REFERENCES (1) McCreery, R. L.; Bergren, A. J.; Progress with Molecular Electronic Junctions: Meeting Experimental Challenges in Design and Fabrication; *Advanced Materials* 2009, 21, 4303.

(2) Bergren, A. J.; Harris, K. D.; Deng, F.; McCreery, R.; Molecular Electronics using Diazonium-Derived Adlayers on Carbon with Cu Top Contacts: Critical Analysis of Metal Oxides and Filaments; *J. Phys. Condens. Matter* 2008, 20, 374117.

(3) McCreery, R.; Wu, J.; Kalakodimi, R. J.; Electron Transport and Redox Reactions in Carbon Based Molecular Electronic Junctions; *Phys. Chem. Chem. Physics.* 2006, 8, 2572.

(4) Anariba, F.; Steach, J.; McCreery, R.; Strong Effects of Molecular Structure on Electron Transport in Carbon/molecule/Copper Electronic Junctions; *J. Phys. Chem. B* 2005, 109, 11163.

(5) McCreery, R.; Dieringer, J.; Solak, A. O.; Snyder, B.; Nowak, A. M.; McGovern, W. R.; DuVall, S.; Molecular Rectification and Conductance Switching in Carbon-Based Molecular Junctions by Structural Rearrangement Accompanying Electron Injection (Correction); *J. Am. Chem. Soc.* 2004, 126, 6200.

(6) Ranganathan, S.; Steidel, I.; Anariba, F.; McCreery, R. L.; Covalently Bonded Organic Monolayers on a Carbon Substrate: A New Paradigm for Molecular Electronics; *Nano Lett.* 2001, 1, 491.

(7) McCreery, R.; Mobley, K. J.; Wu, J.; Electronic Junction Devices Featuring Redox Electrodes; U.S. Pat. No. 7,737,433; 2010

(8) McCreery, R. L.; Chemical Monolayer Field Emitter Device; U.S. Pat. No. 7,019,449 B2; 2006

(9) McCreery, R.; Micro-electronic junctions and devices containing same; U.S. Pat. No. 7,042,006 B2; 2006

(10) McCreery, R.; Chemical Monolayer and Micro-Electronic Junctions and Devices Containing Same; U.S. Pat. No. 7,112,366; 2006

(11) McCreery, R.; Electronic Junction Devices Featuring Redox Electrodes U.S. Pat. No. 7,141,299; 2006

(12) McCreery, R.; Pixel Array; U.S. Pat. No. 6,919,128 B2; 2005

(13) McCreery, R.; Method for Conductance Switching in Molecular Electronic Junctions; U.S. Pat. No. 6,855,950; 2005

(14) McCreery, R.; Chemical Monolayer Memory Device; U.S. Pat. No. 6,855,417; 2005

(15) Ashcroft, N.; Mermin, N. D.; *Solid State Physics*; Brooks/Cole, 1976.

(16) Mazur, U.; Hipps, K. W.; Orbital-Mediated Tunneling, Inelastic Electron Tunneling, and Electrochemical Potentials for Metal Phthalocyanine Thin Films; *The Journal of Physical Chemistry B* 1999, 103, 9721.

(17) Hipps, K. W.; Mazur, U. Inelastic electron tunneling spectroscopy. In *Handbook of Vibrational Spectroscopy*; John Wiley & Sons Ltd.: Chichester, 2002; Vol. 4; pp 812.

(18) Drucker, J.; Hansma, P. K.; Emission of energetic electrons from tunnel junctions; *Phys. Rev. B* 1984, 30, 4348.

(19) Ranganathan, S.; McCreery, R. L.; Electroanalytical Performance of Carbon Films with Near-Atomic Flatness; *Anal. Chem.* 2001, 73, 893.

(20) Ranganathan, S.; McCreery, R. L.; Majji, S. M.; Madou, M.; Photoresist-Derived Carbon for Microelectrochemical Applications; *J. Electrochem. Soc.* 2000, 147, 277

(21) McCreery, R. L.; Advanced Carbon Electrode Materials for Molecular Electrochemistry; *Chem. Rev.* 2008, 108, 2646.

What is claimed is:

1. A two-terminal molecular electronic device comprising:
   a conductor 1 layer;
   a molecule 1 layer;
   a conductor 2 layer; and
   a conductor 1 layer/molecule 1 layer/conductor 2 layer junction formed from the conductor 1 layer, the molecule 1 layer, and the conductor 2 layer, wherein the total thickness of the molecule 1 layer and the conductor 2 layer is less than or approximately equal to the mean free path of a carrier traveling in the two layers, and wherein ballistic transport can occur for some fraction of a plurality of carriers in the two layers.

2. The two-terminal molecular electronic device of claim 1, wherein the molecule 1 layer is covalently bonded to one or both of the conductor 1 layer and the conductor 2 layer.

3. The two-terminal molecular electronic device of claim 2, wherein the molecule 1 layer is irreversibly bonded to the one or both of the conductor 1 layer and the conductor 2 layer.

4. The two-terminal molecular electronic device of claim 1, wherein the molecule 1 layer comprises a species selected from the group consisting of azobenzene, fluorene, and polythiophene.

5. The two-terminal molecular electronic device of claim 1, further comprising a luminescent layer disposed on the conductor 2 layer, wherein hot electrons from the conductor 2 layer excite the luminescent layer to cause light emission.

6. The two-terminal molecular electronic device of claim 1, wherein the conductor 2 layer comprises a luminescent material.

7. The two-terminal molecular electronic device of claim 1, wherein the conductor 1 layer/molecule 1 layer/conductor 2 layer junction is in a vacuum environment, and wherein hot electrons can be ejected from the conductor 2 layer into the vacuum.

8. The two-terminal molecular electronic device of claim 1, wherein the conductor 2 layer comprises a semiconductor material.

9. A three-terminal molecular electronic device comprising:
   a conductor 1 layer;
   a molecule 1 layer;
   a conductor 2 layer
   a molecule 2 layer;
   a conductor 3 layer; and
   a conductor 1 layer/molecule 1 layer/conductor 2 layer/molecule 2 layer/conductor 3 layer junction formed from the conductor 1 layer, the molecule 1 layer, the conductor 2 layer, the molecule 2 layer, and the conductor 3 layer, wherein the total thickness of the molecule 1 layer, the conductor 2 layer, and the molecule2 layer is less than or approximately equal to the mean free path of a carrier traveling in the three layers, and wherein ballistic transport can occur for some fraction of a plurality of carriers in the three layers.

10. The three-terminal molecular electronic device of claim 9, wherein the molecule 1 layer is covalently bonded to one or both of the conductor 1 layer and the conductor 2 layer.

11. The three-terminal molecular electronic device of claim 10, wherein the molecule 1 layer is irreversibly bonded to the one or both of the conductor 1 layer and the conductor 2 layer.

12. The three-terminal molecular electronic device of claim 9, wherein one or both of the molecule 1 layer and the molecule 2 layer comprises a species selected from the group consisting of azobenzene, fluorene, and polythiophene.

13. The three-terminal molecular electronic device of claim 9, wherein interaction of the molecular orbitals of the molecule 1 layer and the molecule 2 layer with the conductor 2 layer results in electron delocalization across both molecular layers and the intermediate conductor 2 layer to provide a single quantum mechanical system with strong interactions between relevant orbitals.

14. The three-terminal molecular electronic device of claim 9, wherein the molecule 1 layer is not covalently bonded to the conductor 2 layer.

15. The three-terminal molecular electronic device of claim 14, wherein one or more of the conductor layers comprises a material selected from the group consisting of carbon, conducting polymers, metals, and conducting metallic compounds.

16. The three-terminal molecular electronic device of claim 9, wherein the molecule 2 layer is not covalently bonded to the conductor 2 layer or the conductor 3 layer, or both.

17. The three-terminal molecular electronic device of claim 16, wherein one or more of the conductor layers comprises a material selected from the group consisting of carbon, conducting polymers, metals, and conducting metallic compounds.

18. The three-terminal molecular electronic device of claim 9, wherein the conductor 2 layer comprises a semiconductor material.

19. A three-terminal molecular electronic device comprising:
   a conductor 1 layer;
   a molecular layer;
   a conductor 2 layer;
   a non-molecular active transport layer;
   a conductor 3 layer; and
   a conductor 1 layer/molecular layer/conductor 2 layer/non-molecular active transport layer/conductor 3 layer junction formed from the conductor 1 layer, the molecular layer, the conductor 2 layer, the non-molecular active transport layer, and the conductor 3 layer, wherein the total thickness of the molecular layer, the conductor 2 layer, and the non-molecular active transport layer is less than or approximately equal to the mean free path of a carrier traveling in the three layers, and wherein ballistic transport can occur for some fraction of a plurality of carriers in the three layers.

20. The three-terminal molecular electronic device of claim 19, wherein the molecular layer is covalently bonded to one or both of the conductor1 layer and the conductor 2 layer.

21. The three-terminal molecular electronic device of claim 20, wherein the molecular layer is irreversibly bonded to the one or both of the conductor 1 layer and the conductor 2 layer.

22. The three-terminal molecular electronic device of claim 19, wherein the molecular layer comprises a species selected from the group consisting of azobenzene, fluorene, and polythiophene.

23. The three-terminal molecular electronic device of claim 19, wherein the non-molecular active transport layer comprises a semimetal or a semiconductor.

24. The three-terminal molecular electronic device of claim 19, wherein interaction of the molecular orbitals of the molecular layer and the non-molecular active transport layer with the conductor 2 layer results in electron delocalization across the molecular layer and the non-molecular active transport layer and the intermediate conductor 2 layer to provide a single quantum mechanical system with strong interactions between relevant orbitals.

25. The three-terminal molecular electronic device of claim 19, wherein the conductor 2 layer comprises a semiconductor material.

* * * * *